CRYOGENIC THREE-TERMINAL DEVICE

Filed Nov. 15, 1962 4 Sheets-Sheet 1

INVENTOR.
IVARS MELNGAILIS
BY Philip Schneider
Louis B. Applebaum
ATTORNEYS

June 28, 1966 I. MELNGAILIS 3,258,664

CRYOGENIC THREE-TERMINAL DEVICE

Filed Nov. 15, 1962 4 Sheets-Sheet 2

INVENTOR.
IVARS MELNGAILIS
BY Philip Schneider
Louis B. Applebaum
ATTORNEYS

June 28, 1966 I. MELNGAILIS 3,258,664

CRYOGENIC THREE-TERMINAL DEVICE

Filed Nov. 15, 1962

4 Sheets-Sheet 3

INVENTOR.

IVARS MELNGAILIS

BY Philip Schneider

Louis B. Applebaum

ATTORNEYS

June 28, 1966 I. MELNGAILIS 3,258,664

CRYOGENIC THREE-TERMINAL DEVICE

Filed Nov. 15, 1962 4 Sheets-Sheet 4

INVENTOR.
IVARS MELNGAILIS
BY Philip Schneider
Louis B. Applebaum
ATTORNEYS

United States Patent Office 3,258,664

Patented June 28, 1966

3,258,664

CRYOGENIC THREE-TERMINAL DEVICE

Ivars Melngailis, Cambridge, Mass., assignor, by mesne assignments, to the United States of America as represented by the Secretary of the Navy

Filed Nov. 15, 1962, Ser. No. 238,066

3 Claims. (Cl. 317—235)

This invention relates to cryogenic, three-terminal, solid-state devices and especially to a three-terminal, semiconductor device employable as a switch and an amplifier at temperatures approximating that of liquid helium.

In recent years, much work has been done in attempting to develop fast switching devices and amplifiers able to follow pulses having fast rise and decay times. The device described herein can follow rise and decay times of less than $2\times10^{-8}$ seconds. It is useful as a fast monostable or bistable switch for computers, a pulse amplifier, a controlled sinusoidal or relaxation oscillator, a unipolar (field effect) transistor, etc.

The object and advantages of the present invention are accomplished by utilizing a biased p-n junction to control the ionization between two ohmic contacts on a piece of semiconductor material which is at a cryogenic temperature viz., at a temperature approximating that of liquid helium. A typical embodiment of the device comprises a wafer of germanium of n-type conductivity bearing two spaced ohmic contacts and formed with an indium-alloyed p-n junction between the contacts, the device being maintained at the temperature of liquid helium. Reverse biasing voltage is applied between a contact at the indium-alloyed junction and one of the ohmic contacts, and the output circuit is connected between the ohmic-contact terminals.

An object of the invention is to provide a three-terminal, cryogenic, semiconductor device in which the ionization of the semiconductor material between a pair of ohmic contacts is controlled by the bias applied to a p-n junction.

Another object is to provide a device of this type having a fast response time.

A further object is to provide a device of this type having a high input impedance.

Yet another object is to provide a memory device capable of nondestructive readout.

Other objects and many of the attendant advantages of this invention will be readily appreciated as the same becomes better understood by reference to the following detailed description when considered in connection with the accompanying drawings wherein:

FIG. 1(*b*) is a side view of the cryosistor shown in FIG. 1(*a*);

FIG. 4 is a graph of curves of the breakdown voltage of the cryosistor in terms of the bias voltage applied to the p-n junction.

Figure 1A:
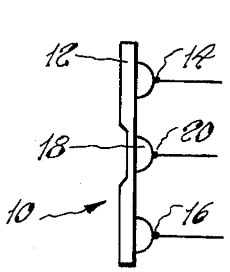
FIG. 1(*a*) is a plan view of a cryosister formed in accordance with this invention.
Figure 1B:
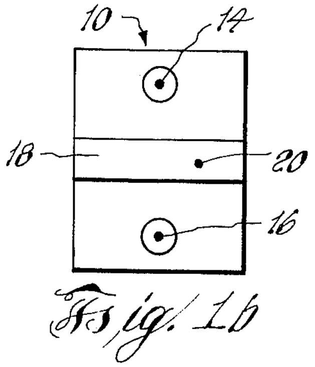

FIG. 1 illustrates a cryosistor 10 fabricated in accordance with this invention. A thin wafer 12 of germanium of n-type conductivity is provided with a pair of ohmic-contact terminals 14 and 16. Indium is alloyed with the germanium to form a p-n junction 18 and a contact 20 is made therewith. The type of germanium employed may, for example, be the same as the n-type germanium used in the Lincoln Laboratories' bistable cryosar. This material has both n- and p-type impurities with an excess of n-type impurities which makes it an n-type semiconductor material. The material may thus be referred to as "double impurity" semiconductor material, or "double impurity" n-type germanium, for example.

It should be noted from FIG. 1(*a*) that the central section of the cryosistor, adjacent to the p-n junction 18, is thinner than the rest of the wafer. The purpose of this narrowing is to make the conduction channel between the ohmic contacts thin enough to permit blocking the flow of carriers therethrough by application of reverse bias between contacts 20 and 16, or 20 and 14.

Figure 2:
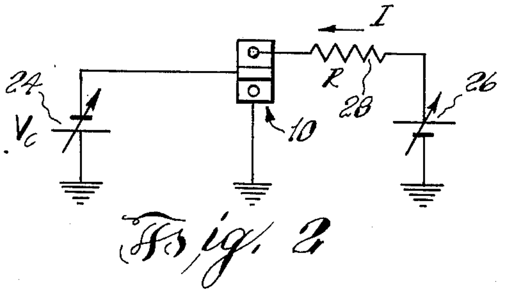
FIG. 2 is a schematic diagram illustrating a circuit utilizing the cryosistor.
Figure 2:
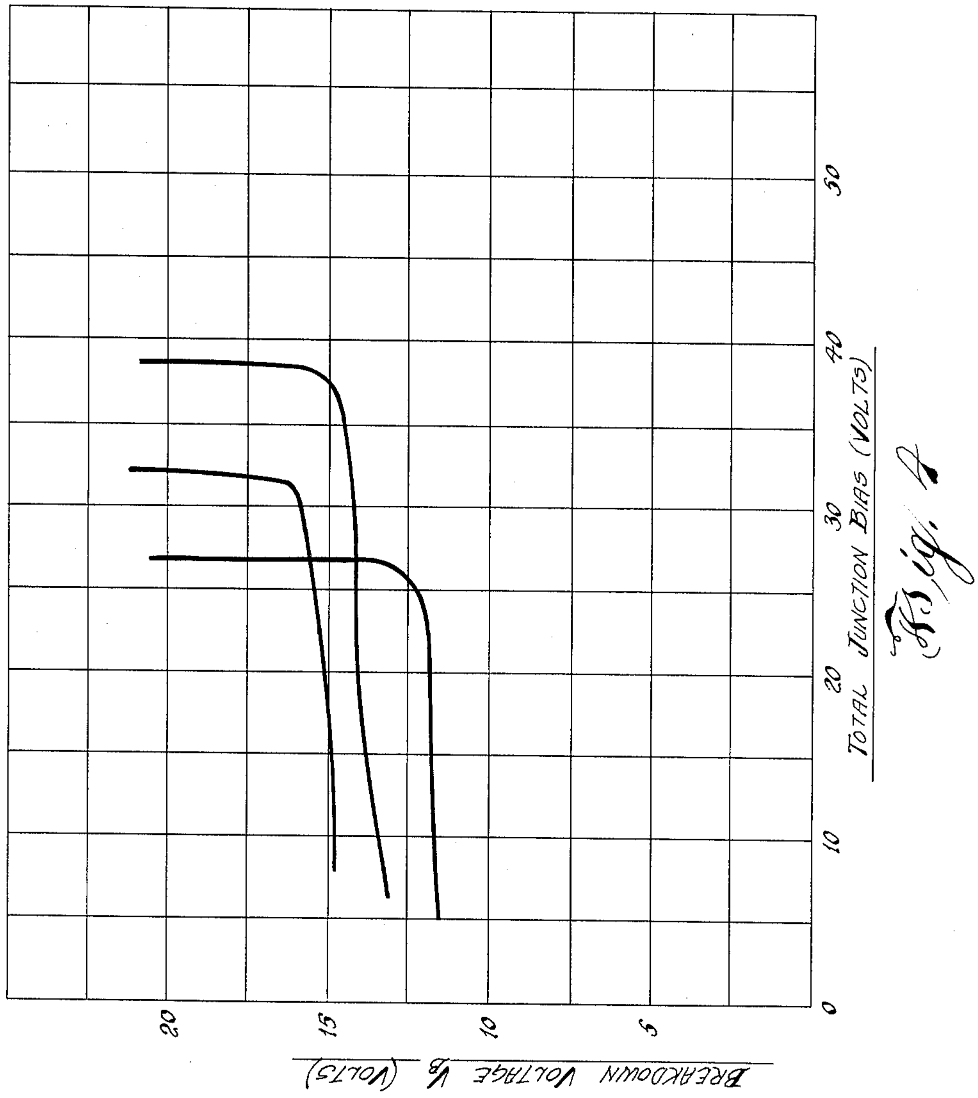
Figure 5:
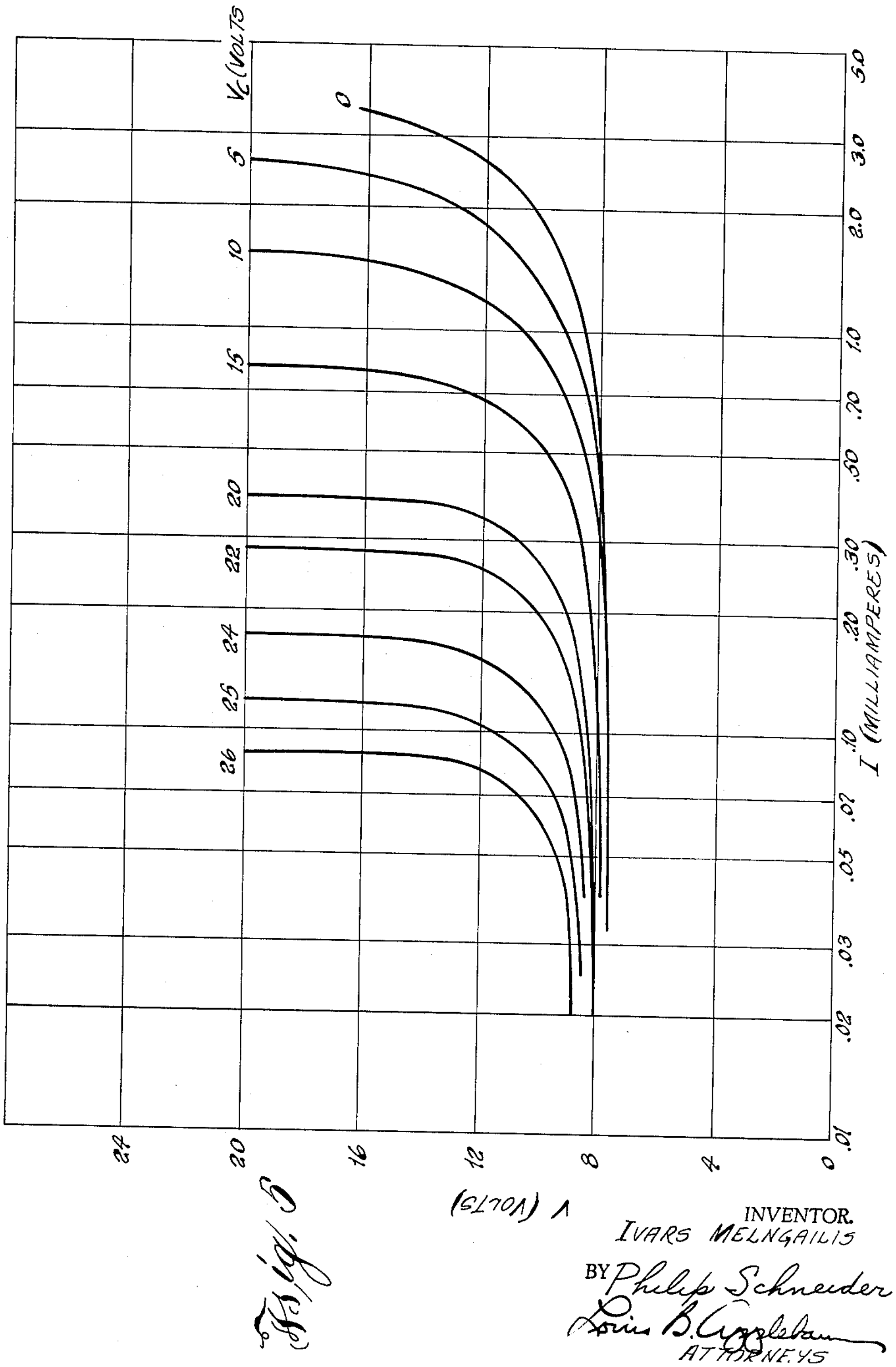
FIG. 5 is a graph of a family of curves showing the volt-ampere characteristic of a cryosistor for various values of bias voltage.

FIG. 2 shows a circuit which may be used to obtain the static characteristics of the cryosistor of the p-n biasing source 24 and the supply source 26 for applying a voltage between the ohmic contacts 14 and 16 are variable voltage sources. A resistance 28, functioning as a current limiter and a means to develop an output voltage, is inserted between the ohmic-contact supply source 26 and ohmic contact 14. A typical value for this resistance might be 50,000 ohms.

Figure 3:
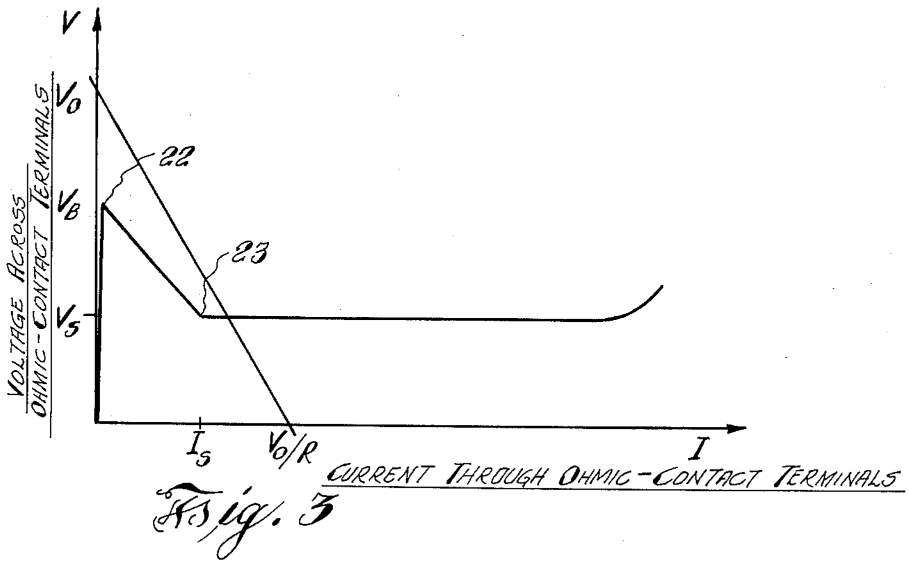
FIG. 3 is a graph depicting the cryosistor voltage-current characteristic with zero biasing voltage.

The voltage-current characteristics of the cryosistor at liquid helium temperature is shown in FIG. 3. This curve is obtained with no bias voltage applied across the p-n junction.

The curve exhibits a negative resistance characteristic between points 22 and 23. With no bias applied at the p-n junction, the germanium between the ohmic contacts 14 and 16 ionizes and conducts current when the supply source 26 exceeds the breakdown voltage, $V_B$. Applying a bias voltage across the p-n junction in the reverse direction causes a depletion of carriers from the region under the junction thereby reducing the thickness of the conducting channel between the ohmic contacts 14 and 16. As the reverse bias is decreased (increased in negative direction), the value of voltage necessary to cause breakdown, or ionization, remains fairly constant until a critical value of biasing voltages is reached beyond which no ionization occurs even if the supply voltage, $V_o$, is considerably larger than the breakdown voltage, $V_b$. In FIG. 4, breakdown voltages are plotted against values of reverse bias for three different cryosistors. It is apparent that a critically biased cryosistor can be used as an amplifier of pulse voltage and power, since small pulses can permit or prevent ionization of the device. It is also apparent that the negative resistance exhibited over part of the characteristic of the cryosistor permits utilization of the device as an oscillator. The negative resistance characteristic, which is essential for bistable operation of the cryosistor, is obtained through the use of compensated semiconductor material (e.g., either n-type germanium containing a smaller but comparable density of p-type impurities, or p-type germanium containing a smaller but comparable density of n-type impurities). The previously mentioned Lincoln Laboratories' cryosar is fabricated from semiconductor material of this kind.

Owing to the biasing action of the voltage across the p-n junction and the bistable nature of the material itself, the biasing voltage actually has two distinct critical values. With a constant value of ohmic-contact supply voltage greater than the breakdown voltage ($V_o>V_B$), the ionized channel deionizes at a certain value of biasing voltage, $V_c$, say $V_{c1}$, as $V_c$ is increased (made more negative). A subsequent decrease of $V_c$ causes breakdown at a value, $V_{c2}$, which is smaller (more positive) than $V_{c1}$. If the D.-C. bias voltage across the p-n junction is placed between these critical values $V_{c1}$ and $V_{c2}$, bistable switching induced by input pulses is possible with pulses of no more than $2\times10^{-8}$ seconds duration. Current rise- and decay-times in the load are less than this amount, depending on the pulse amplitude and the applied voltages.

FIG. 4 is a graph showing the voltage-current characteristics of three different cryosistors for various values of junction bias voltage, $V_c$.

Figure 6:
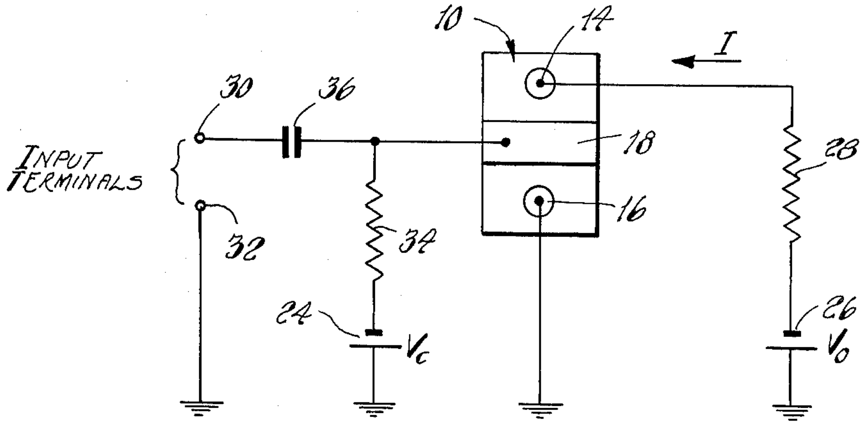
FIG. 6 is a schematic diagram of a circuit employing a cryosistor.

A utilization circuit which can be employed with the cryosistor 10 is shown in FIG. 6. The circuit is similar to that of FIG. 2. An input circuit resistance 34, a D.-C. blocking capacitor 36 and a pair of input terminals 30 and 32 have been added in series with the source of biasing voltage 24. Pulses to change the state of the cryosistor 10 may be applied to the input terminals. The output can be derived across the output resistance 28 or across the combination of the output resistance 28 and the ohmic-contact supply source 26 (i.e., across the ohmic contacts 14 and 16). Typical component values might be the following:

Resistance 28: 10K to 100K ohms
Resistance 34: 100K ohms
Condenser 36: 0.1 microfarad.

Variations of the device comprise use of a p-type wafer with an n-type alloyed area and use of other types of semiconductor materials, to form the wafer and the p-n junction, as known to the transistor art.

Obviously, many modifications and variations of the present invention are possible in the light of the above teachings. It is therefore to be understood that within the scope of the appended claims the invention may be practiced otherwise than as specifically described.

I claim:

1. A three-terminal cryogenic semiconductor device comprising, in combination:

a wafer of double-impurity semiconductor material of one type of conductivity, said material exhibiting a negative resistance characteristic;

a pair of spaced ohmic contacts formed on said wafer;

semiconductor material, of a type opposite to that of said wafer, located between said ohmic contacts and forming a p-n junction with said wafer;

control means connected to said region of opposite-conductivity-type for controlling the flow of current through said wafer material; and means for maintaining the temperature of the device roughly at the temperature of liquid helium.

2. A device as set forth in claim 1, wherein said double-impurity semiconductor material of which said wafer is fabricated is n-type material.

3. A device as set forth in claim 1, wherein said wafer is narrowed in the region adjacent to said p-n junction between said ohmic contacts.

References Cited by the Examiner

UNITED STATES PATENTS

| | | | |
|---|---|---|---|
| 2,769,926 | 11/1956 | Lesk | 317—235 |
| 2,907,934 | 10/1959 | Engel | 307—88.5 |
| 2,975,344 | 3/1961 | Wegener | 317—235 |
| 2,980,808 | 4/1961 | Steele | 307—88.5 |
| 3,009,085 | 11/1961 | Petrit | 317—235 |
| 3,021,433 | 2/1962 | Morrison | 307—88.5 |
| 3,048,797 | 8/1962 | Linder | 307—88.5 |

OTHER REFERENCES

The Cryosar—A New Low Temperature Computer Component, by McWhorter et al., MIT Lincoln Laboratories, June 1961 (first two pages relied on).

JOHN W. HUCKERT, *Primary Examiner.*

J. D. CRAIG, *Assistant Examiner.*